(12) United States Patent
Takenouchi

(10) Patent No.: US 10,665,482 B2
(45) Date of Patent: May 26, 2020

(54) PLATE-SHAPED WORKPIECE PROCESSING METHOD INCLUDING FIRST AND SECOND CUTTING STEPS, WHERE THE SECOND STEP INCLUDES USE OF A CUTTING FLUID CONTAINING AN ORGANIC ACID AND AN OXIDIZING AGENT

(71) Applicant: DISCO CORPORATION, Tokyo (JP)

(72) Inventor: Kenji Takenouchi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/940,468

(22) Filed: Mar. 29, 2018

(65) Prior Publication Data
US 2018/0286709 A1 Oct. 4, 2018

(30) Foreign Application Priority Data

Apr. 4, 2017 (JP) .................... 2017-074247

(51) Int. Cl.
*H01L 21/67* (2006.01)
*H01L 21/78* (2006.01)
(Continued)

(52) U.S. Cl.
CPC .... *H01L 21/67092* (2013.01); *H01L 21/3043* (2013.01); *H01L 21/6836* (2013.01);
(Continued)

(58) Field of Classification Search
CPC ......... H01L 21/78–786; H01L 21/3043; H01L 21/6836; B28D 5/022–029
See application file for complete search history.

(56) References Cited

U.S. PATENT DOCUMENTS 5,266,528 A * 11/1993 Yamada ............... B28D 5/022
148/DIG. 28
6,280,298 B1 8/2001 Gonzales
(Continued)

FOREIGN PATENT DOCUMENTS

| JP | 06349926 A | 12/1994 |
| JP | 09055573 A | 2/1997 |
| JP | 2005021940 A | 1/2005 |

OTHER PUBLICATIONS

Takenouchi, Kenji, U.S. Appl. No. 15/934,491, filed Mar. 23, 2018.
(Continued)

*Primary Examiner* — Laura M Menz
*Assistant Examiner* — Candice Chan
(74) *Attorney, Agent, or Firm* — Greer Burns & Crain, Ltd.

(57) ABSTRACT

A method for processing a plate-shaped workpiece having a division line and a metal member formed on the division line or in an area corresponding to the division line includes a holding step of holding the workpiece on a chuck table with the metal member oriented downward, a first cutting step of cutting the workpiece along the division line by using a first cutting blade, thereby forming a first cut groove having a bottom not reaching the metal member, and a second cutting step of cutting the workpiece along the first cut groove by using a second cutting blade, thereby forming a second cut groove fully cutting the workpiece along the division line so as to divide the metal member. The second cutting step includes supplying a cutting fluid containing an organic acid and an oxidizing agent to the workpiece.

12 Claims, 5 Drawing Sheets

(51) Int. Cl.
  *H01L 21/304* (2006.01)
  *H01L 21/683* (2006.01)
  *H01L 21/687* (2006.01)

(52) U.S. Cl.
  CPC ........ *H01L 21/68714* (2013.01); *H01L 21/78* (2013.01); *H01L 2221/68327* (2013.01)

(56) References Cited

U.S. PATENT DOCUMENTS

| | | |
|---|---|---|
| 6,310,017 B1 | 10/2001 | Grant et al. |
| 6,461,940 B1 | 10/2002 | Hasegawa et al. |
| 6,791,197 B1 | 9/2004 | Katz |
| 9,130,057 B1 | 9/2015 | Kumar et al. |
| 9,349,647 B2 | 5/2016 | Takenouchi |
| 2001/0041387 A1* | 11/2001 | Tateiwa ............... B28D 5/022 438/114 |
| 2003/0124771 A1 | 7/2003 | Maiz |
| 2004/0209443 A1* | 10/2004 | Cadieux ............. B28D 5/0076 438/460 |
| 2004/0212047 A1 | 10/2004 | Joshi et al. |
| 2006/0105546 A1 | 5/2006 | Genda et al. |
| 2006/0223234 A1 | 10/2006 | Terayama et al. |
| 2008/0191318 A1 | 8/2008 | Su et al. |
| 2008/0277806 A1 | 11/2008 | Chen et al. |
| 2011/0048200 A1 | 3/2011 | Ide et al. |
| 2012/0286415 A1 | 11/2012 | Sakai et al. |
| 2013/0203237 A1 | 8/2013 | Yamaguchi et al. |
| 2013/0234193 A1 | 9/2013 | Odnoblyudov et al. |
| 2014/0017882 A1 | 1/2014 | Lei et al. |
| 2014/0154871 A1 | 6/2014 | Hwang et al. |
| 2015/0262881 A1 | 9/2015 | Takenouchi |
| 2015/0279738 A1 | 10/2015 | Wells et al. |
| 2015/0279739 A1 | 10/2015 | Lei et al. |
| 2017/0213757 A1 | 7/2017 | Nakamura et al. |
| 2018/0166328 A1 | 6/2018 | Tang et al. |

OTHER PUBLICATIONS

Takenouchi, Kenji, U.S. Appl. No. 15/934,443, filed Mar. 23, 2018.
Takenouchi, Kenji, U.S. Appl. No. 15/936,622, filed Mar. 27, 2018.
Takenouchi, Kenji, U.S. Appl. No. 15/937,441, filed Mar. 27, 2018.
Takenouchi, Kenji, U.S. Appl. No. 15/937,402, filed Mar. 27, 2018.
Takenouchi, Kenji, U.S. Appl. No. 15/938,832, filed Mar. 28, 2018.
Takenouchi, Kenji, U.S. Appl. No. 15/938,755, filed Mar. 28, 2018.
Takenouchi, Kenji, U.S. Appl. No. 15/940,411, filed Mar. 29, 2018.
Takenouchi, Kenji, U.S. Appl. No. 15/941,131, filed Mar. 30, 2018.
Takenouchi, Kenji, U.S. Appl. No. 15/942,682, filed Apr. 2, 2018.

* cited by examiner

PLATE-SHAPED WORKPIECE PROCESSING METHOD INCLUDING FIRST AND SECOND CUTTING STEPS, WHERE THE SECOND STEP INCLUDES USE OF A CUTTING FLUID CONTAINING AN ORGANIC ACID AND AN OXIDIZING AGENT

BACKGROUND OF THE INVENTION

Field of the Invention

The present invention relates to a plate-shaped workpiece processing method for processing a plate-shaped workpiece having a division line and a metal member formed on the division line or in an area corresponding to the division line.

Description of the Related Art

A wafer such as a semiconductor wafer has a front side on which a plurality of devices are formed so as to be separated by a plurality of crossing division lines. The wafer thus having the devices is cut along the division lines and thereby divided into individual device chips. There is a case that a metal film is formed on the back side of the wafer, so as to improve the electrical characteristics of each device. However, when the metal film is cut by a cutting blade, the cutting blade may be clogged. Furthermore, when the wafer is cut by this cutting blade clogged, there arises a problem such that cracking may occur in the wafer or the cutting blade may be damaged.

In another case, a TEG (Test Element Group) as a metal member is formed on each division line of the wafer, so as to measure the electrical characteristics of each device. When this wafer having the TEG is cut along each division line by a cutting blade, the cutting blade may be clogged. As another plate-shaped workpiece having a division line and a metal member formed on the division line, a package substrate is known. The package substrate has an electrode surface on which a plurality of electrodes are formed. In a processing method for the package substrate, the package substrate is cut from the electrode surface by a cutting blade and thereby divided into individual packages. When the package substrate is cut from the electrode surface by the cutting blade, there is a problem such that burrs may be generated from the electrodes in cutting the package substrate. To prevent the clogging of the cutting blade, there has been proposed in Japanese Patent Laid-open No. 1997-55573 a method of cutting a workpiece having metal electrodes by using a carbide-tipped saw blade in place of the cutting blade.

SUMMARY OF THE INVENTION

In the cutting method disclosed in Japanese Patent Laid-open No. 1997-55573, however, the carbide-tipped saw blade has no self-sharpening function unlike the cutting blade, so that the sharpness of the saw blade is lowered at once. Accordingly, the frequency of exchange of the saw blade becomes high to cause a reduction in workability. On the other hand, when the metal member formed on the workpiece is cut by a cutting blade, the cutting blade may be clogged as described above and there also arises another problem such that the metal member cut by the cutting blade is elongated, causing the generation of burrs or the occurrence of dragging. In general, when a feed speed is increased, a cutting load is increased and a processing heat generated in cutting the workpiece is increased, resulting in an increase in degree of burrs or dragging. Accordingly, it is difficult to increase the feed speed from the viewpoint of prevention of a degradation in processing quality.

It is therefore an object of the present invention to provide a plate-shaped workpiece processing method for processing a plate-shaped workpiece having a division line and a metal member formed on the division line or in an area corresponding to the division line, in which the feed speed can be increased by this method as compared with the prior art.

In accordance with an aspect of the present invention, there is provided a plate-shaped workpiece processing method for processing a plate-shaped workpiece having a division line and a metal member formed on the division line or in an area corresponding to the division line, the plate-shaped workpiece processing method including a holding step of holding the plate-shaped workpiece on a chuck table in the condition where the metal member is oriented downward; a first cutting step of cutting the plate-shaped workpiece along the division line by using a first cutting blade after performing the holding step, thereby forming a first cut groove having a bottom not reaching the metal member; and a second cutting step of cutting the plate-shaped workpiece along the first cut groove by using a second cutting blade after performing the first cutting step, thereby forming a second cut groove fully cutting the plate-shaped workpiece along the division line so as to divide the metal member; the second cutting step including the step of supplying a cutting fluid containing an organic acid and an oxidizing agent to the plate-shaped workpiece.

According to the processing method of the present invention, the plate-shaped workpiece is cut in two steps in its thickness direction by using the first and second cutting blades. Accordingly, the thickness of the workpiece to be cut in each step can be reduced, so that the processing speed (feed speed) in cutting the workpiece can be increased as compared with the case of fully cutting the workpiece in one step. Furthermore, in performing the second cutting step, the cutting fluid containing an organic acid and an oxidizing agent is supplied to the workpiece. Accordingly, the metal present on the workpiece is modified by the organic acid contained in the cutting fluid, so that the ductility of the metal is suppressed to thereby suppress the generation of burrs. Moreover, the film property on the surface of the metal member is changed by the oxidizing agent contained in the cutting fluid, so that the ductility of the metal member is lost to cause easy cutting, thereby improving the workability.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
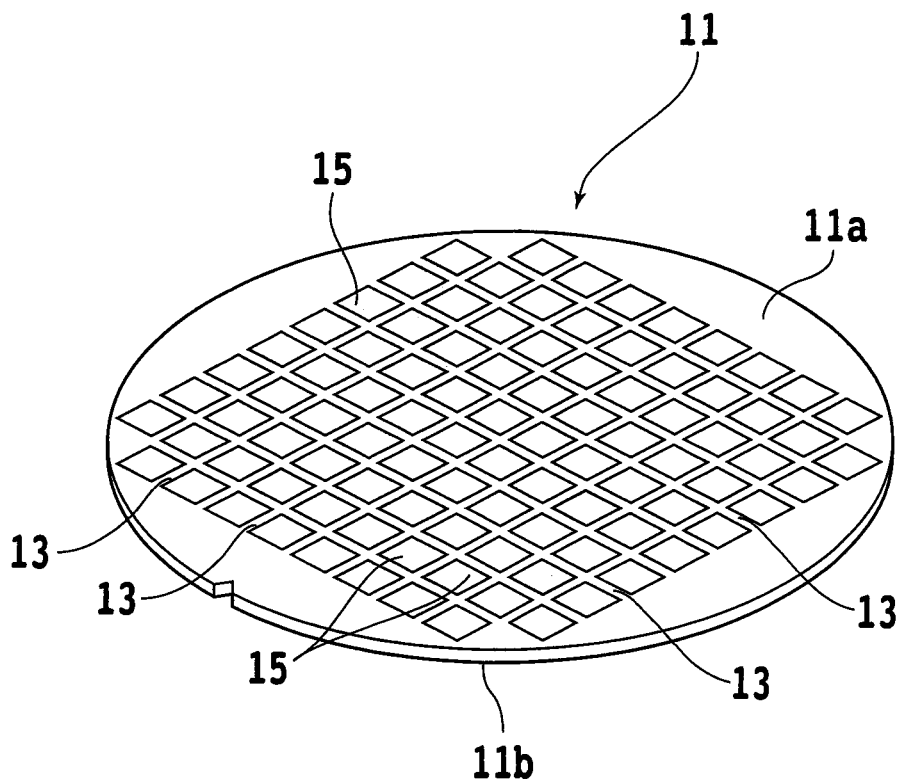
FIG. 1A is a perspective view of a semiconductor wafer as viewed from the front side thereof.
Figure 1B:
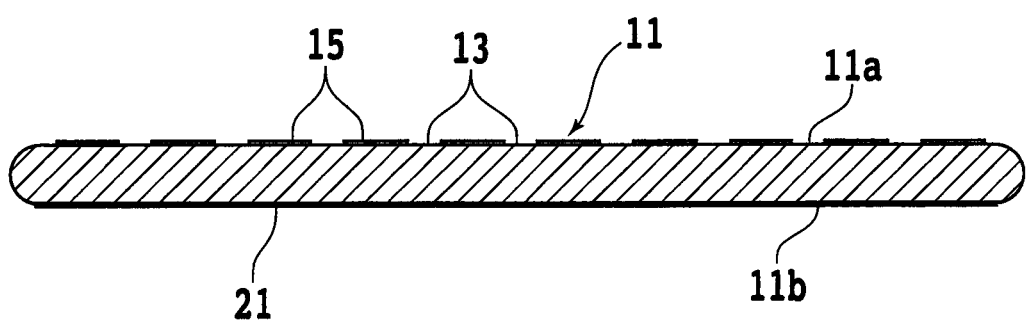
FIG. 1B is a sectional view of the semiconductor wafer shown in FIG. 1A.
Figure 2:
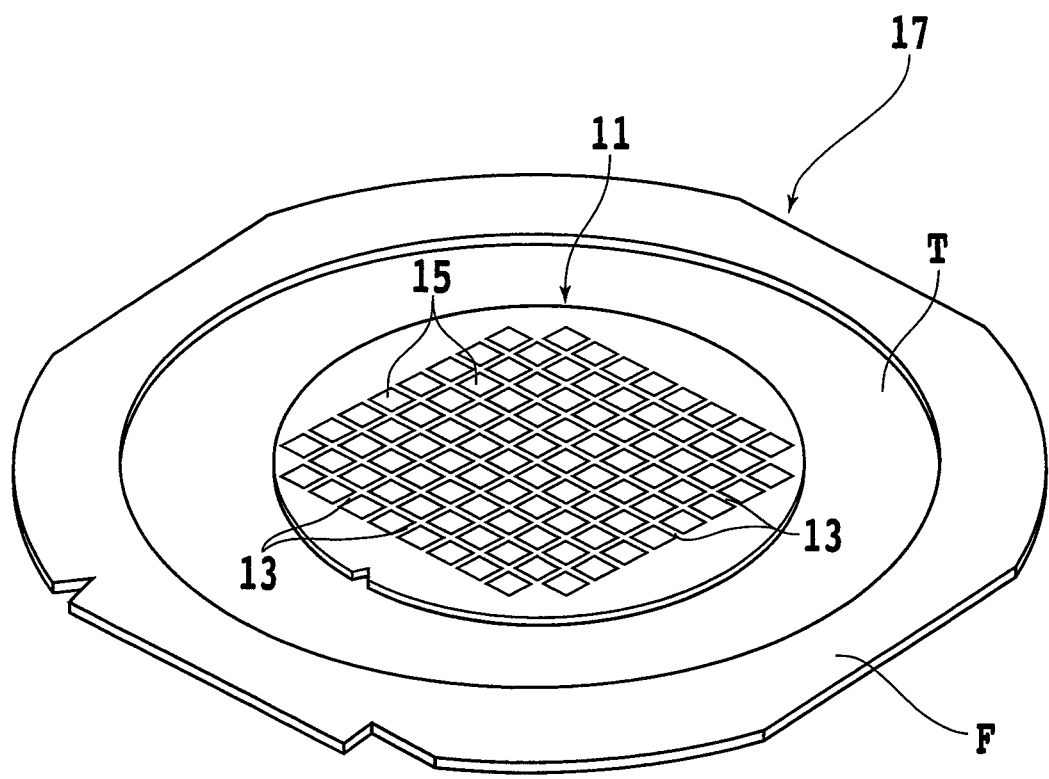
FIG. 2 is a perspective view of a wafer unit configured by supporting the semiconductor wafer through a dicing tape to an annular frame.

Preferred embodiments of the present invention will now be described in detail with reference to the drawings. Referring to FIG. 1A, there is shown a perspective view of a semiconductor wafer (which will be hereinafter sometimes referred to simply as wafer) 11. As shown in FIG. 1A, the semiconductor wafer 11 has a front side 11a and a back side 11b. In FIG. 1A, the front side 11a of the semiconductor wafer 11 is shown. FIG. 1B is a sectional view of the semiconductor wafer 11. A plurality of crossing division lines 13 are formed on the front side 11a of the wafer 11 to thereby define a plurality of separate regions where a plurality of devices 15 such as LSIs (Large Scale Integrated Circuits) are formed. More specifically, the plural crossing division lines 13 are composed of a plurality of parallel division lines extending in a first direction and a plurality of parallel division lines extending in a second direction perpendicular to the first direction. As shown in FIG. 1B, a metal film 21 of copper (Cu) or aluminum (Al), for example, is formed on the back side 11b of the wafer 11. Referring to FIG. 2, there is shown a perspective view of a wafer unit 17 configured by supporting the wafer 11 through a dicing tape T to an annular frame F. In the wafer processing method according to this preferred embodiment, the wafer 11 is processed in the form of the wafer unit 17 shown in FIG. 2. More specifically, the back side 11b of the wafer 11 is attached to the dicing tape T in its central portion, and the peripheral portion of the dicing tape T is attached to the annular frame F.

Figure 3A:
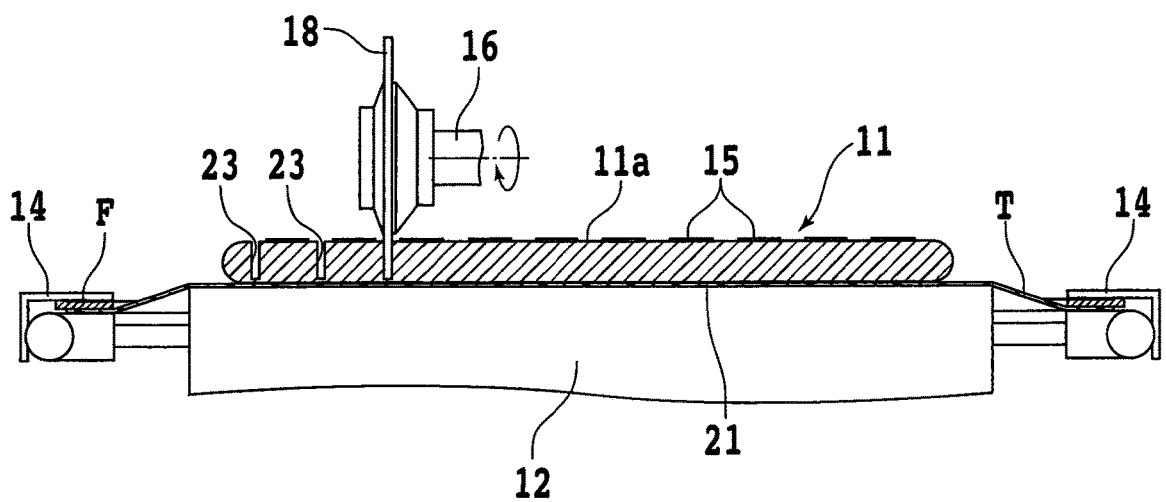
FIG. 3A is a partially sectional side view showing a first cutting step.

In the wafer processing method according to this preferred embodiment, a holding step is first performed to hold the wafer 11 through the dicing tape T on a chuck table 12 of a cutting apparatus under suction in the condition where the metal film 21 formed on the back side 11b of the wafer 11 is oriented downward as shown in FIG. 3A. Further, the annular frame F is fixed by a plurality of clamps 14 provided on the outer circumference of the chuck table 12 as shown in FIG. 3A. Accordingly, the wafer 11 is held through the dicing tape T on the chuck table 12 in the condition where the front side 11a of the wafer 11 is exposed. In this condition, a first cutting step is performed to cut the wafer 11 from the front side 11a along the division lines 13 by using a cutting blade 18 as a first cutting blade, thereby forming a first cut groove 23 having a bottom not reaching the metal film 21 along each division line 13 as shown in FIG. 3A.

Prior to performing this first cutting step, an alignment step known in the art is performed by using an imaging unit (not shown) included in the cutting apparatus. That is, the imaging unit is operated to image the front side 11a of the wafer 11 held on the chuck table 12. According to an image obtained by the imaging unit, the cutting blade 18 mounted on the front end of a spindle 16 is aligned with a target one of the division lines 13. After performing this alignment step, the first cutting step is performed in such a manner that the cutting blade 18 is rotated at a high speed and relatively moved along the target division line 13 to cut the wafer 11 from the front side 11a along the target division line 13, thereby forming the first cut groove 23 along the target division line 13, wherein the first cut groove 23 has a bottom not reaching the metal film 21 formed on the back side 11b of the wafer 11.

Figure 3B:
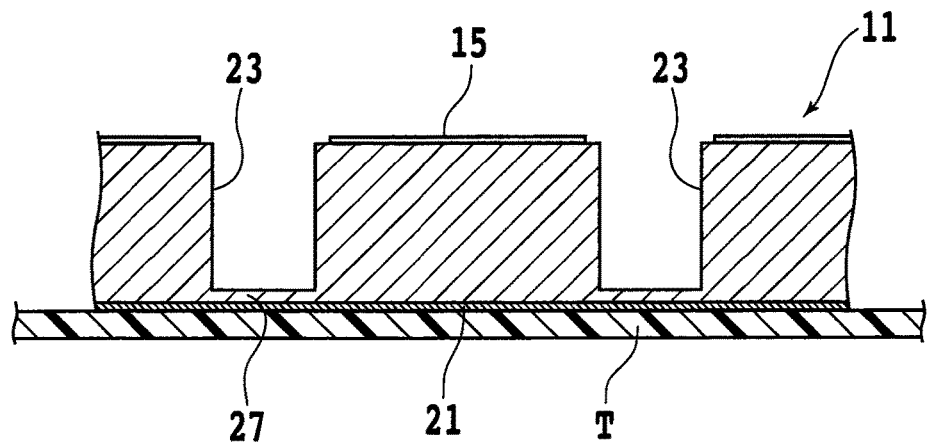
FIG. 3B is an enlarged sectional view of the semiconductor wafer processed by the first cutting step.

This first cutting step is repeatedly performed along all of the division lines 13 extending in the first direction as indexing the cutting blade 18 by the pitch of the division lines 13. Thereafter, the chuck table 12 is rotated 90 degrees to similarly perform the first cutting step along all of the other division lines 13 extending in the second direction perpendicular to the first direction. FIG. 3B is an enlarged sectional view of the wafer 11 processed by the first cutting step.

As shown in FIG. 3B, an uncut portion 27 is left between the bottom of each first cut groove 23 and the lower surface of the metal film 21. While the thickness of this uncut portion 27 is not especially limited, the thickness of this uncut portion 27 is preferably set to approximately 20 to 30 μm in consideration of handleability of the subsequent steps.

Figure 4A:
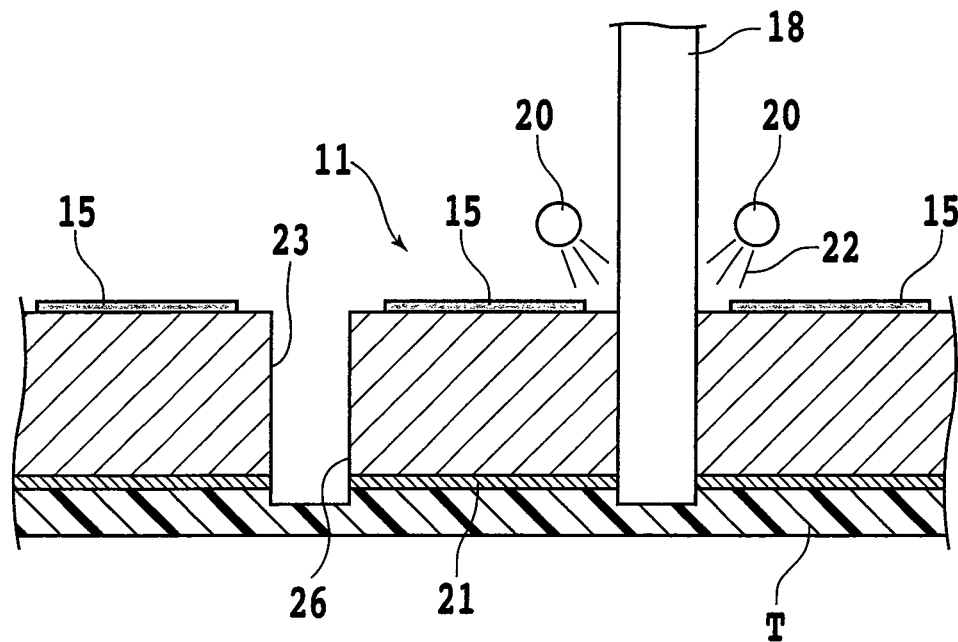
FIG. 4A is an enlarged sectional view showing a second cutting step in the case of using the same cutting blade as that used in the first cutting step.

After performing the first cutting step, a second cutting step is performed to cut the wafer 11 along each first cut groove 23 by using a second cutting blade, thereby forming a second cut groove fully cutting the wafer 11 along each division line 13 so as to divide the metal film 21. In this second cutting step, a cutting fluid containing an organic acid and an oxidizing agent is supplied to the wafer 11. FIG. 4A shows a first preferred embodiment of the second cutting step. In the first preferred embodiment shown in FIG. 4A, the same cutting blade 18 as that used in the first cutting step is used as the second cutting blade to thereby form a second cut groove 26 fully cutting the wafer 11 along each first cut groove 23 previously formed. As shown in FIG. 4A, a pair of cutting fluid nozzles 20 are provided on both sides of the cutting blade 18, so as to supply a cutting fluid 22 containing an organic acid and an oxidizing agent to the wafer 11. That is, the wafer 11 is cut along each first cut groove 23 by the cutting blade 18 as supplying the cutting fluid 22 containing an organic acid and an oxidizing agent to the wafer 11 in such a manner that the lower edge of the cutting blade 18 cuts the bottom of each first cut groove 23 until reaching the dicing tape T and that the chuck table 12 holding the wafer 11 through the dicing tape T is fed. As a result, the second cut groove 26 is formed so as to fully cut the wafer 11 in such a manner that the metal film 21 formed on the back side 11b (lower surface) of the wafer 11 is divided by the second cut groove 26. Accordingly, the second cut groove 26 has the same width as that of the first cut groove 23 in the first preferred embodiment.

As the organic acid, there can be used amino acids. Examples of the amino acids usable here include glycine, dihydroxyethylglycine, glycylglycine, hydroxyethylglycine, N-methylglycine, β-alanine, L-alanine, L-2-aminobutyric acid, L-norvaline, L-valine, L-leucine, L-norleucine, L-alloisoleucine, L-isoleucine, L-phenylalanine, L-proline, sarcosine, L-ornithine, L-lysine, taurine, L-serine, L-threonine, L-allothreonine, L-homoserine, L-thyroxine, L-tyrosine, 3,5-diiodo-L-tyrosine, β-(3,4-dihydroxyphenyl)-L-alanine, 4-hydroxy-L-proline, L-cysteine, L-methionine, L-ethionine, L-lanthionine, L-cystathionine, L-cystine, L-cystic acid, L-glutamic acid, L-aspartic acid, S-(carboxymethyl)-L-cysteine, 4-aminobutyric acid, L-asparagine, L-glutamine, azaserine, L-canavanine, L-citrulline, L-arginine, δ-hydroxy-L-lysine, creatine, L-kynurenine, L-histidine, 1-methyl-L-histidine, 3-methyl-L-histidine, L-tryptophane, actinomycin C1, ergothioneine, apamin, angiotensin I, angiotensin II, antipain, etc. Among others, particularly preferred are glycine, L-alanine, L-proline, L-histidine, L-lysine, and dihydroxyethylglycine.

Also, amino polyacids can be used as the organic acid. Examples of the amino polyacids usable here include iminodiacetic acid, nitrilotriacetic acid, diethylenetriaminepentaacetic acid, ethylenediaminetetraacetic acid, hydroxyethyliminodiacetic acid, nitrilotrismethylenephosphonic acid, ethylenediamine-N,N,N',N'-tetramethylenesulfonic acid, 1,2-diaminopropanetetraacetic acid, glycol ether diaminetetraacetic acid, transcyclohexanediaminetetraacetic acid, ethylenediamineorthohydroxyphenylacetic acid, ethylenediaminedisuccinic acid (SS isomer), β-alaninediacetic acid, N-(2-carboxylatoethyl)-L-aspartic acid, N—N'-bis(2-hydroxybenzyl)ethylenediamine-N,N'-diacetic acid, etc.

Further, carboxylic acids can be used as the organic acid. Examples of the carboxylic acids usable here include saturated carboxylic acids such as formic acid, glycolic acid, propionic acid, acetic acid, butyric acid, valeric acid, hexanoic acid, oxalic acid, malonic acid, glutaric acid, adipic acid, malic acid, succinic acid, pimelic acid, mercaptoacetic acid, glyoxylic acid, chloroacetic acid, pyruvic acid, acetoacetic acid, etc., unsaturated carboxylic acids such as acrylic acid, methacrylic acid, crotonic acid, fumaric acid, maleic acid, mesaconic acid, citraconic acid, aconitic acid, etc., and cyclic unsaturated carboxylic acids such as benzoic acids, toluic acid, phthalic acids, naphthoic acids, pyromellitic acid, naphthalic acid, etc.

As the oxidizing agent, there can be used, for example, hydrogen peroxide, peroxides, nitrates, iodates, periodates, hypochlorites, chlorites, chlorates, perchlorates, persulfates, dichromates, permanganates, cerates, vanadates, ozonated water, silver(II) salts, iron(III) salts, and their organic complex salts.

Besides, an anticorrosive may be mixed in the cutting fluid 22. Mixing of the anticorrosive makes it possible to prevent corrosion (elution) of the metal included in the package substrate 2. As the anticorrosive, there is preferably used a heterocyclic aromatic ring compound which has at least three nitrogen atoms in its molecule and has a fused ring structure or a heterocyclic aromatic ring compound which has at least four nitrogen atoms in its molecule. Further, the aromatic ring compound preferably includes a carboxyl group, sulfo group, hydroxyl group, or alkoxyl group. Specific preferable examples of the aromatic ring compound include tetrazole derivatives, 1,2,3-triazole derivatives, and 1,2,4-triazole derivatives.

Examples of the tetrazole derivatives usable as the anticorrosive include those which do not have a substituent group on the nitrogen atoms forming the tetrazole ring and which have, introduced into the 5-position of the tetrazole, a substituent group selected from the group consisting of sulfo group, amino group, carbamoyl group, carbonamide group, sulfamoyl group, and sulfonamide group, or an alkyl group substituted with at least one substituent group selected from the group consisting of hydroxyl group, carboxyl group, sulfo group, amino group, carbamoyl group, carbonamide group, sulfamoyl group, and sulfonamide group.

Examples of the 1,2,3-triazole derivatives usable as the anticorrosive include those which do not have a substituent group on the nitrogen atoms forming the 1,2,3-triazole ring and which have, introduced into the 4-position and/or 5-position of the 1,2,3-triazole, a substituent group selected from the group consisting of hydroxyl group, carboxyl group, sulfo group, amino group, carbamoyl group, carbonamide group, sulfamoyl group, and sulfonamide group, or an alkyl or aryl group substituted with at least one substituent group selected from the group consisting of hydroxyl group, carboxyl group, sulfo group, amino group, carbamoyl group, carbonamide group, sulfamoyl group, and sulfonamide group.

Besides, examples of the 1,2,4-triazole derivatives usable as the anticorrosive include those which do not have a substituent group on the nitrogen atoms forming the 1,2,4-triazole ring and which have, introduced into the 2-position and/or 5-position of 1,2,4-triazole, a substituent group selected from the group consisting of sulfo group, carbamoyl group, carbonamide group, sulfamoyl group, and sulfonamide group, or an alkyl or aryl group substituted with at least one substituent group selected from the group consisting of hydroxyl group, carboxyl group, sulfo group, amino group, carbamoyl group, carbonamide group, sulfamoyl group, and sulfonamide group.

As described above, the cutting fluid 22 containing an organic acid and an oxidizing agent is supplied from the cutting fluid nozzles 20 in the second cutting step. Accordingly, the metal forming the metal film 21 is modified by the organic acid contained in the cutting fluid 22, so that the ductility of the metal can be suppressed to thereby suppress the generation of burrs. Furthermore, the film property on the surface of the metal film 21 is changed by the oxidizing agent contained in the cutting fluid 22, so that the ductility of the metal film 21 is lost to thereby exhibit the effect that the metal film 21 can be easily cut to improve the workability.

This second cutting step is repeatedly performed along all of the division lines 13 extending in the first direction as indexing the cutting blade 18 by the pitch of the division lines 13. Thereafter, the chuck table 12 is rotated 90 degrees to similarly perform the second cutting step along all of the other division lines 13 extending in the second direction perpendicular to the first direction. Thus, the wafer 11 can be divided into individual device chips each having the metal film 21 on the back side.

Figure 4B:
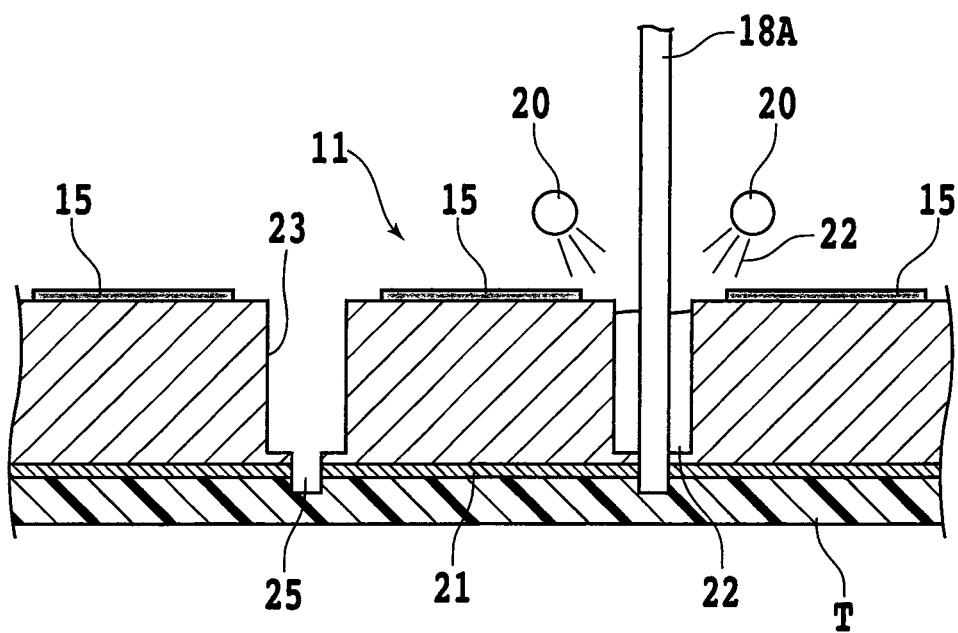
FIG. 4B is a view similar to FIG. 4A, showing the case of using a cutting blade having a thickness smaller than that of the cutting blade used in the first cutting step.

Referring to FIG. 4B, there is shown a second preferred embodiment of the second cutting step. In the second preferred embodiment shown in FIG. 4B, a cutting blade 18A having a thickness smaller than that of the cutting blade 18 used in the first cutting step is used as the second cutting blade to thereby form a second cut groove 25 fully cutting the wafer 11 along each first cut groove 23 previously formed. Accordingly, the second cut groove 25 shown in FIG. 4B has a width smaller than that of the first cut groove 23, i.e., smaller than that of the second cut groove 26 shown in FIG. 4A. As shown in FIG. 4B, the wafer 11 is cut along each first cut groove 23 by the cutting blade 18A as supplying the cutting fluid 22 containing an organic acid and an oxidizing agent to the wafer 11 in such a manner that the lower edge of the cutting blade 18A cuts the bottom of each first cut groove 23 along its center until reaching the dicing tape T and that the chuck table 12 holding the wafer 11 through the dicing tape T is fed. As a result, the second cut groove 25 is formed so as to fully cut the wafer 11 in such a manner that the metal film 21 formed on the back side 11b (lower surface) of the wafer 11 is divided by the second cut groove 25.

This second cutting step is repeatedly performed along all of the division lines 13 extending in the first direction as indexing the cutting blade 18A by the pitch of the division lines 13. Thereafter, the chuck table 12 is rotated 90 degrees to similarly perform the second cutting step along all of the other division lines 13 extending in the second direction perpendicular to the first direction. Thus, the wafer 11 can be divided into individual device chips each having the metal film 21 on the back side.

While the processing method of the present invention is applied to the semiconductor wafer 11 having the metal film 21 on the back side 11b in the above preferred embodiment, the applicability of the present invention is not limited to such a workpiece. For example, the processing method of the present invention is also applicable to a wafer having a TEG (Test Element Group) formed on each division line on the front side or a package substrate having electrodes formed on each division line on the front side. Further, while the cutting fluid 22 is supplied from the pair of nozzles 20 located on both sides of the cutting blade 18 or 18A in the second cutting step, any nozzle means capable of supplying the cutting fluid 22 may be adopted in the present invention.

Figure 5:
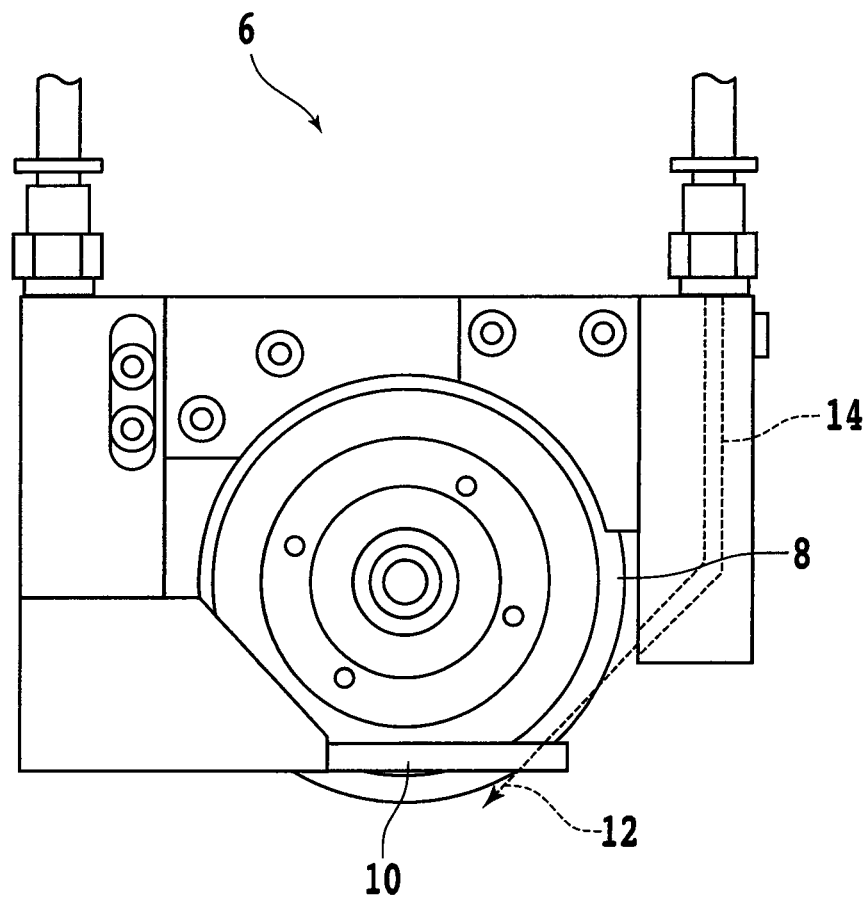
FIG. 5 is a side view showing nozzle means for supplying a cutting fluid in the second cutting step according to a modification.

FIG. 5 is a side view of a cutting unit 6 including such nozzle means capable of supplying the cutting fluid 22 according to a modification. As shown in FIG. 5, the cutting unit 6 includes a nozzle (shower nozzle) 24 for supplying the cutting fluid 22, in addition to the cutting blade 18 and the pair of nozzles 20. The nozzle 24 is located on the front side of the cutting blade 18 in its cutting direction (feeding direction). By supplying the cutting fluid 22 from the nozzle 24, the cutting fluid 22 can be easily supplied into each first cut groove 23, so that the metal film 21 can be modified effectively by the cutting fluid 22. In particular, the nozzle opening of the nozzle 24 is preferably directed obliquely downward, e.g., toward the work position where the cutting blade 18 cuts the workpiece) as shown in FIG. 5. With this configuration, the metal film 21 can be modified more effectively by the cutting fluid 22. While the pair of nozzles 20 and the nozzle 24 are used to supply the cutting fluid 22 in the modification shown in FIG. 5, only the nozzle 24 may be used to supply the cutting fluid 22.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A plate-shaped workpiece processing method for processing a plate-shaped workpiece having a division line and a metal member formed on said division line or in an area corresponding to said division line, said plate-shaped workpiece processing method comprising:
    a holding step of holding said plate-shaped workpiece on a chuck table in the condition where said metal member is oriented downward;
    a first cutting step of cutting said plate-shaped workpiece along said division line by using a first cutting blade after performing said holding step, thereby forming a first cut groove having a bottom not reaching said metal member; and
    a second cutting step of cutting said plate-shaped workpiece along said first cut groove by using a second cutting blade after performing said first cutting step, thereby forming a second cut groove fully cutting said plate-shaped workpiece along said division line so as to divide said metal member, wherein said second cutting blade contacts said metal member during said second cutting step;
    said second cutting step including the step of supplying a cutting fluid containing an organic acid and an oxidizing agent to said plate-shaped workpiece, wherein the metal member is modified by the organic acid to suppress the ductility thereof, thereby suppressing generation of burrs, and a film property on a surface of the metal member is changed by the oxidizing agent.

2. The plate-shaped workpiece processing method according to claim 1, wherein said second cutting blade has a thickness smaller than a thickness of said first cutting blade.

3. The plate-shaped workpiece processing method according to claim 1, wherein the metal member is formed on an entire back surface of the plate-shaped workpiece, and a plurality of devices are formed on a front surface of the plate-shaped workpiece.

4. The plate-shaped workpiece processing method according to claim 1, whereby a thickness of an uncut portion at the bottom of the first cut groove is between approximately 20 μm and approximately 30 μm.

5. The plate-shaped workpiece processing method according to claim 1, wherein the metal member is formed of copper.

6. The plate-shaped workpiece processing method according to claim 1, wherein the metal member is formed of aluminum.

7. A plate-shaped workpiece processing method for processing a plate-shaped workpiece having a division line and a metal member formed on said division line or in an area corresponding to said division line, said plate-shaped workpiece processing method comprising:
    a holding step of holding said plate-shaped workpiece on a chuck table in the condition where said metal member is oriented downward;
    a first cutting step of cutting said plate-shaped workpiece along said division line by using a first cutting blade after performing said holding step, thereby forming a first cut groove having a bottom not reaching said metal member; and
    a second cutting step of cutting said plate-shaped workpiece along said first cut groove by using a second cutting blade after performing said first cutting step, thereby forming a second cut groove fully cutting said plate-shaped workpiece along said division line so as to divide said metal member, wherein said second cutting blade contacts said metal member during said second cutting step;
    said second cutting step including the step of supplying a cutting fluid containing an organic acid and an oxidizing agent to said plate-shaped workpiece, and
    wherein said second cutting blade is the same as said first cutting blade.

8. The plate-shaped workpiece processing method according to claim 7, wherein the metal member is modified by the organic acid to suppress the ductility thereof, thereby suppressing generation of burrs, and a film property on a surface of the metal member is changed by the oxidizing agent.

9. The plate-shaped workpiece processing method according to claim 7, wherein the metal member is formed on an entire back surface of the plate-shaped workpiece, and a plurality of devices are formed on a front surface of the plate-shaped workpiece.

10. The plate-shaped workpiece processing method according to claim 7, whereby a thickness of an uncut portion at the bottom of the first cut groove is between approximately 20 μm and approximately 30 μm.

11. The plate-shaped workpiece processing method according to claim 7, wherein the metal member is formed of copper.

12. The plate-shaped workpiece processing method according to claim 7, wherein the metal member is formed of aluminum.

* * * * *